(12) United States Patent
Kim et al.

(10) Patent No.: US 11,276,646 B2
(45) Date of Patent: Mar. 15, 2022

(54) ELECTRONIC COMPONENT MODULE

(71) Applicant: Samsung Electro-Mechanics Co., Ltd., Suwon-si (KR)

(72) Inventors: Jong Yun Kim, Suwon-si (KR); Chang Ju Lee, Suwon-si (KR); Gye Won Lee, Suwon-si (KR); Hee Sun Oh, Suwon-si (KR); Hong Seok Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/423,908

(22) Filed: May 28, 2019

(65) Prior Publication Data
US 2020/0258841 A1     Aug. 13, 2020

(30) Foreign Application Priority Data
Feb. 13, 2019    (KR) .................. 10-2019-0016889

(51) Int. Cl.
*H01L 23/538*     (2006.01)
*H01L 23/31*      (2006.01)
*H01L 23/367*     (2006.01)
*H05K 1/18*       (2006.01)
*H01L 23/552*     (2006.01)

(52) U.S. Cl.
CPC ...... *H01L 23/5385* (2013.01); *H01L 23/3128* (2013.01); *H01L 23/367* (2013.01); *H01L 23/5386* (2013.01); *H01L 23/552* (2013.01); *H05K 1/181* (2013.01); *H05K 2201/10378* (2013.01)

(58) Field of Classification Search
CPC . H01L 23/5385; H01L 23/552; H01L 23/367; H01L 23/5386; H01L 23/3128; H05K 1/181; H05K 2201/10378
See application file for complete search history.

(56) References Cited

U.S. PATENT DOCUMENTS

| | | | |
|---|---|---|---|
| 7,645,634 B2 * | 1/2010 | Karnezos | H01L 25/16 438/107 |
| 2004/0106229 A1 * | 6/2004 | Jiang | H01L 25/0657 438/106 |
| 2004/0108590 A1 | 6/2004 | Kledzik et al. | |

(Continued)

FOREIGN PATENT DOCUMENTS

| | | |
|---|---|---|
| JP | 2008-091714 A | 4/2008 |
| JP | 2016-082022 A | 5/2016 |

(Continued)

OTHER PUBLICATIONS

Korean Office Action dated Mar. 19, 2020 in corresponding Korean Patent Application No. 10-2019-0016889 (9 pages in English, 6 pages in Korean).

*Primary Examiner* — Marcos D. Pizarro
*Assistant Examiner* — Sue Tang
(74) *Attorney, Agent, or Firm* — NSIP Law

(57) ABSTRACT

An electronic component module includes a first substrate mounted on an upper surface of a second substrate such that at least a portion of a lower surface of the first substrate is exposed externally of the second substrate and electronic devices mounted on the first substrate and the second substrate, including at least one electronic device mounted on the upper surface of the second substrate.

19 Claims, 11 Drawing Sheets

(56) References Cited

U.S. PATENT DOCUMENTS

| | | | |
|---|---|---|---|
| 2007/0152313 A1* | 7/2007 | Periaman | H01L 25/0657 257/686 |
| 2008/0179737 A1 | 7/2008 | Haga et al. | |
| 2010/0038761 A1* | 2/2010 | Tay | H01L 23/13 257/676 |
| 2010/0237483 A1* | 9/2010 | Chi | H01L 23/13 257/686 |
| 2013/0020702 A1 | 1/2013 | Zhai et al. | |
| 2015/0195913 A1 | 7/2015 | Cho | |
| 2016/0088720 A1* | 3/2016 | Willis | H01L 23/3677 361/709 |
| 2017/0117200 A1* | 4/2017 | Kim | H01L 21/485 |

FOREIGN PATENT DOCUMENTS

| | | |
|---|---|---|
| KR | 10-2003-0071764 A | 9/2003 |
| KR | 10-1409946 B1 | 6/2014 |
| KR | 10-2015-0081217 A | 7/2015 |
| WO | WO 2007/064779 A1 | 6/2007 |

\* cited by examiner

ELECTRONIC COMPONENT MODULE

CROSS-REFERENCE TO RELATED APPLICATION

This application claims the benefit under 35 USC 119(a) of Korean Patent Application No. 10-2019-0016889 filed on Feb. 13, 2019 in the Korean Intellectual Property Office, the entire disclosure of which is incorporated herein by reference for all purposes.

BACKGROUND

1. Field

The following description relates to an electronic component module, and more particularly, to an electronic component module in which a thickness may be significantly reduced, while efficiently using a mounting space.

2. Description of Background

The market for electronic products has rapidly increased with demand for portable electronic devices. To satisfy such demand, miniaturization and weight reductions of electronic components mounted on such devices are required.

To implement miniaturization and weight reduction of such electronic components, not only a technique of reducing individual sizes of mounting parts but also a system-on-chip (SOC) technology for making a plurality of individual elements into one chip or a system-in-package (SIP) technology for integrating individual elements into one package, are required.

In addition, as mobile devices such as smartphones and tablet PCs are required to be slimmed while retaining high performance and multi-functionality, miniaturization and thinning of mounting parts are increasingly demanded. Accordingly, there is a demand for a package technology capable of lowering a mounting height of mounting parts.

In detail, as portable terminals are required to be downsized and thinned, electronic component modules mounted on portable terminals are required to have a significantly reduced size while having various functions.

SUMMARY

Examples provide an electronic component module in which both surfaces of a substrate may be used as mounting surfaces, a mounting area may be significantly increased, and a mounting height may be significantly reduced.

Examples provide an electronic component module capable of effectively dissipating heat generated in a heat generating element.

In one general aspect, an electronic component module includes a first substrate mounted on an upper surface of a second substrate such that at least a portion of a lower surface of the first substrate is exposed externally of the second substrate and electronic devices mounted on the first substrate and the second substrate, including at least one electronic device mounted on the upper surface of the second substrate.

The first substrate may be mounted on the second substrate along an edge of the second substrate.

The second substrate may have a quadrangular shape, and the first substrate may have a quadrangular ring shape.

The first substrate may include a device accommodating portion to accommodate the at least one electronic device mounted on the upper surface of the second substrate.

The at least one electronic device mounted on the upper surface of the second substrate may have a mounting height lower than a sum of a thickness of the first substrate and a mounting height of an electronic device mounted on an upper surface of the first substrate.

At least one electronic device may be mounted on the lower surface of the first substrate.

The at least one electronic device mounted on the lower surface of the first substrate may have a mounting height lower than a thickness of the second substrate.

The second substrate may include a support portion protruding outwardly to support the lower surface of the first substrate.

The electronic component module may include a third substrate mounted on an upper surface of the first substrate.

The third substrate may be disposed such that a lower surface of the third substrate faces the upper surface of the second substrate.

The second substrate and the third substrate may have the same size.

The at least one electronic device mounted on the upper surface of the second substrate may have a mounting height lower than a thickness of the first substrate.

The electronic component module may include a sealing portion sealing the electronic devices.

The electronic component module may include a shielding layer disposed along a surface of the sealing portion.

The second substrate may include a heat dissipation pad disposed on a lower surface of the second substrate, and the heat dissipation pad may be in surface contact with an upper surface of a main substrate through a heat transfer member in a case in which the second substrate is mounted on the main substrate.

The second substrate may include a heat dissipation via having one end connected to the at least one electronic device mounted on the upper surface of the second substrate and another end connected to the heat dissipation pad, to transfer heat generated by the at least one electronic device mounted on the upper surface of the second substrate to the heat dissipation pad.

In another general aspect, an electronic component module includes a first substrate mounted on an upper surface of a second substrate such that at least a portion of a lower surface of the first substrate is exposed externally of the second substrate; a heat generating element mounted on the second substrate; and at least one electronic device mounted on both an upper surface of the first substrate and the lower surface of the first substrate.

The heat generating element may have a mounting height lower than a sum of a thickness of the first substrate and a mounting height of the at least one electronic device mounted on the upper surface of the first substrate.

In another general aspect, an electronic component module includes a first substrate; a second substrate mounted on the first substrate and comprising an opening disposed along an edge portion of an upper surface of the first substrate on which the second substrate is mounted; a first electronic device mounted on the upper surface of the first substrate and extending through the opening; and a second electronic device mounted on a lower surface of the second substrate, which faces the upper surface of the first substrate, in a region external to the edge portion.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
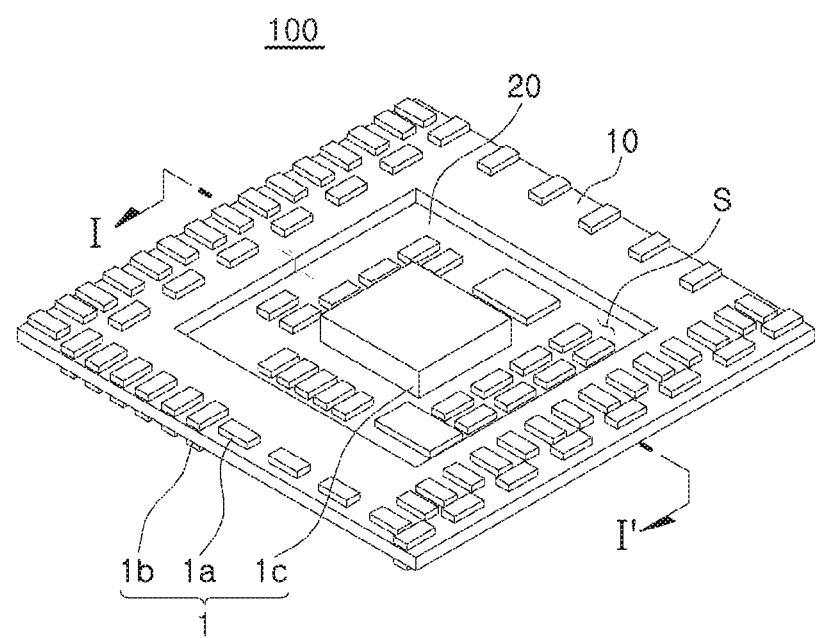
FIG. 1 is a perspective view of an electronic component module according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Hereinafter, examples of the present disclosure will be described in detail with reference to the accompanying drawings. In the drawings, the same reference numerals will be used throughout to designate the same or like elements. Further, the detailed description of well-known functions and constructions that may obscure the gist of the present disclosure will be omitted. For the same reason, some of the components in the accompanying drawings may be exaggerated, omitted, or schematically illustrated, and the depicted dimensions of respective components may not accurately reflect the actual size of the components.

Figure 2:
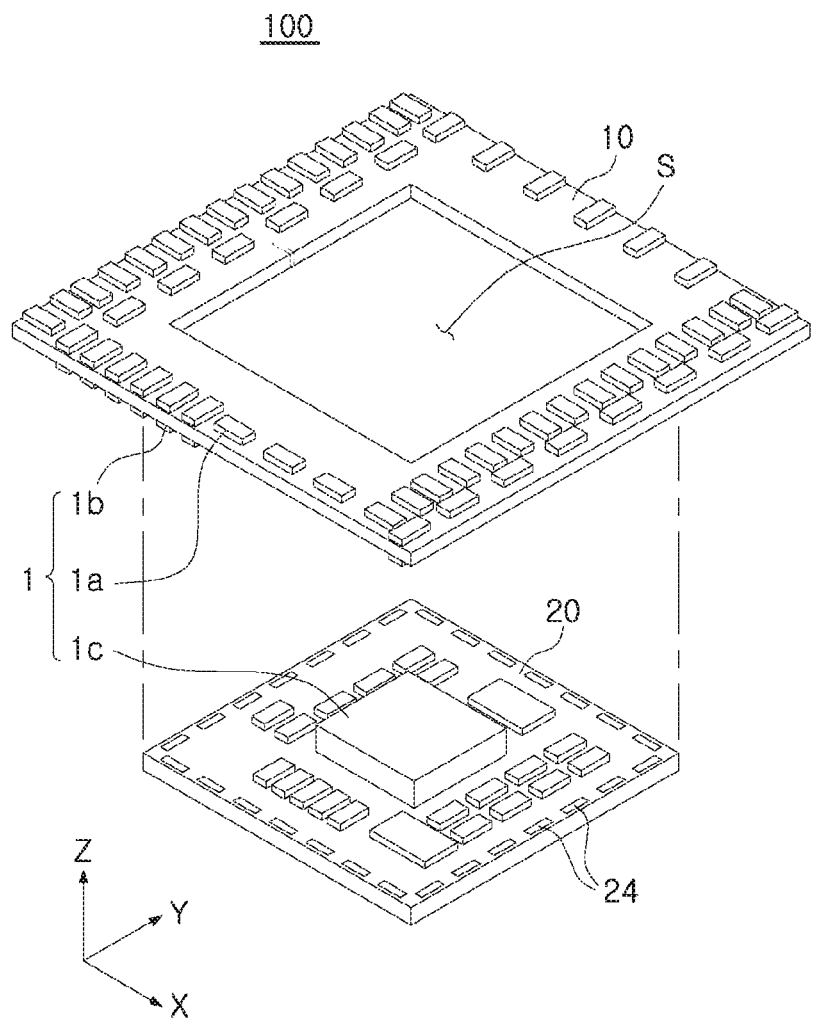
FIG. 2 is an exploded perspective view of the electronic component module illustrated in FIG. 1.
Figure 3:
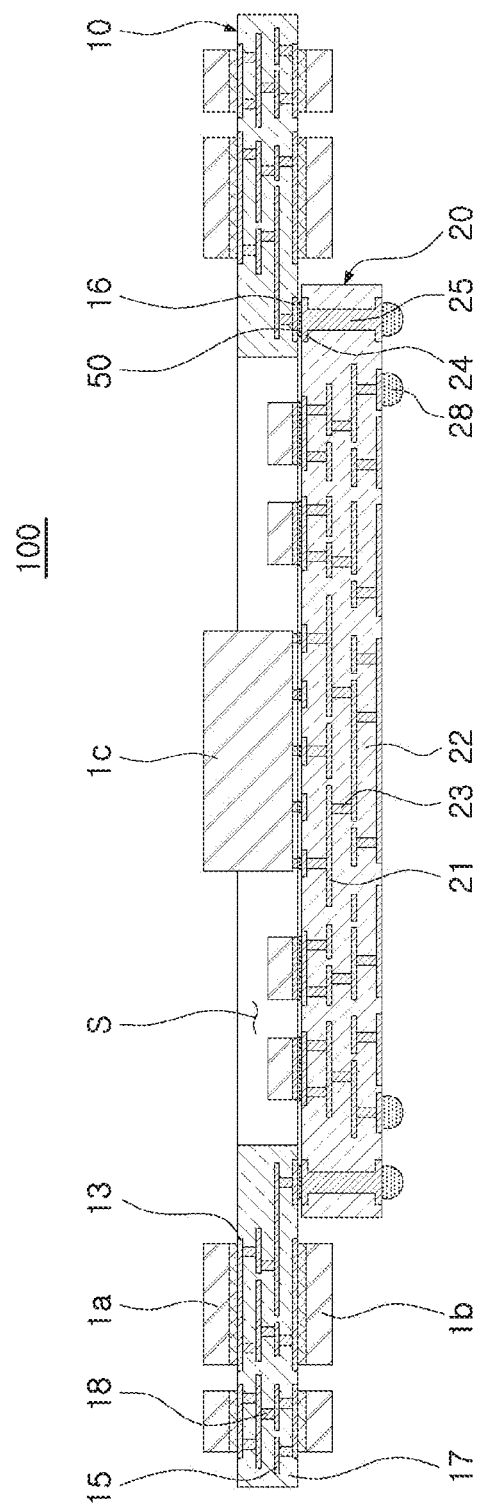
FIG. 3 is a cross-sectional view taken along line I-I' of FIG. 1.
Figure 4:
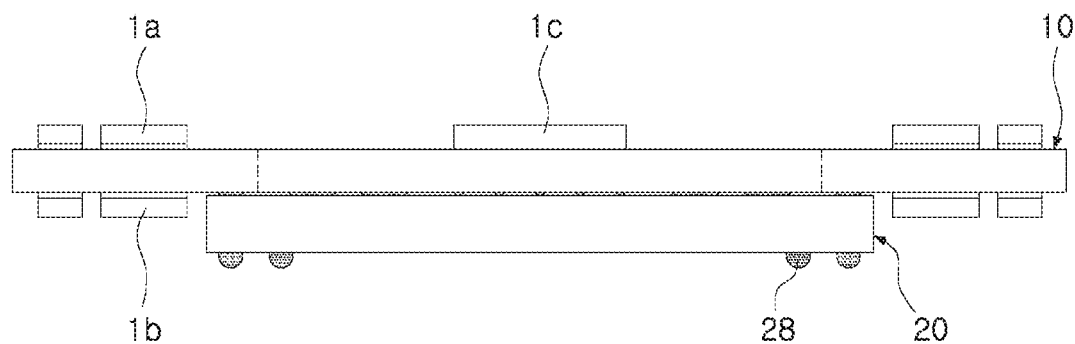
FIG. 4 is a side view of the electronic component module illustrated in FIG. 1.

FIG. 1 is a perspective view of an electronic component module according to an example, and FIG. 2 is an exploded perspective view of the electronic component module illustrated in FIG. 1. FIG. 3 is a cross-sectional view taken along line I-I' of FIG. 1, and FIG. 4 is a side view of the electronic component module illustrated in FIG. 1.

Referring to FIGS. 1 to 4, an electronic component module 100 may include an electronic device 1, a first substrate 10, and a second substrate 20.

The electronic device 1 includes various devices such as a passive device and an active device, and any device that may be mounted on the substrate may be used as the electronic device 1.

The electronic device 1 may be classified as at least one first device 1a mounted on a first surface (an upper surface) of the first substrate 10, a second device 1b mounted on a second surface (a lower surface) of the first substrate 10, and a third device 1c mounted on a first surface (an upper surface) of the second substrate 20.

The second device 1b, for example, a plurality of second devices 1b are configured to have a mounting height lower than a thickness of the second substrate 20. In this case, the mounting height refers to a height from the surface of the substrate 10 or 20 on which the electronic device 1 is mounted to a top surface of a relevant electronic device 1.

The third device 1c may include elements having a relatively greatest mounting height among the electronic devices. For example, the third device 1c may have a mounting height higher than a thickness of the first substrate 10. The third device 1c may include at least one heat generating element that generates a lot of heat during operation.

The first substrate 10 may be a multilayer substrate in which a plurality of insulating layers 17 and a plurality of wiring layers 15 are repeatedly stacked. Alternatively, the first substrate 10 may be configured as a double-sided board in which a wiring layer 15 is formed on both surfaces of one insulating layer 17.

A material of the insulating layer 17 is not particularly limited. As the material of the insulating layer 17, for example, a thermosetting resin such as an epoxy resin, a thermoplastic resin such as a polyimide, or a resin in which these resins are impregnated with a core material such as glass fiber, glass cloth, glass fabric or the like together with an inorganic filler, for example, an insulation material such as a prepreg resin, Ajinomoto Build-up Film (ABF) resin, FR-4 resin, Bismaleimide Triazine (BT) resin, or the like, may be used.

The wiring layer 15 may electrically connect the electronic devices 1 and electrically connect the electronic devices 1 and the second substrate 20.

As a material of the wiring layer 15, a conductive material such as copper (Cu), aluminum (Al), silver (Ag), tin (Sn), gold (Au), nickel (Ni), lead (Pb), titanium (Ti), or alloys thereof may be used.

Inside the insulating layer 17, interlayer connection conductors 18 to interconnect the stacked wiring layers 15 are disposed.

An insulating protective layer (not illustrated) may be disposed on a surface of the first substrate 10. The insulating protective layer is disposed to cover both the insulating layer 17 and the wiring layer 15 on an upper surface and a lower surface of the insulating layer 17, thereby protecting the wiring layer 15 disposed on the upper surface or the lower surface of the insulating layer 17.

The electronic device 1 may be mounted on both surfaces of the first substrate 10. To this end, mounting electrodes 13 for mounting of the electronic device 1 or a wiring pattern (not illustrated) for electrically connecting the mounting electrodes 13 may be formed on both surfaces of the first substrate 10. As the first substrate 10, various kinds of substrates, for example, a ceramic substrate, a printed circuit board, a flexible substrate, or the like may be used.

The example of FIGS. 1 to 4 illustrates the case in which the first substrate 10 is composed of one substrate and a device accommodating portion S in the form of a through hole is formed, by way of example, but is not limited thereto. For example, the first substrate 10 may also be composed of a plurality of substrates.

The device accommodating portion S is used as a space in which the third devices 1c to be mounted on the first surface of the second substrate 20 are accommodated. Thus, the third devices 1c mounted on the first surface of the second substrate 20 are located only on a position facing the device accommodating portions S on the first surface of the first substrate 10.

In this example, the first substrate 10 is formed to have a quadrangular shape, and the device accommodating portion S is also formed in a quadrangular shape. Accordingly, the first substrate 10 is formed to have a quadrangular ring shape. However, the shape of the first substrate 10 is not limited thereto, and may be variously modified as required. For example, the shape of the device accommodating portion S and the outer shape of the first substrate 10 may be formed to have different shapes as necessary.

The first substrate 10 is mounted on the second substrate 20. To this end, a connection pad 16 is provided on a second surface of the first substrate 10. The connection pad 16 is bonded to an electrode pad 24 of the second substrate 20 through a connection conductor 50, and thus, the first substrate 10 may be electrically connected to the second substrate 20.

The connection pad 16 is disposed in a position facing the electrode pad 24 of the second substrate 20 in a lower surface of the first substrate 10.

The connection pad 16 may be provided as a plurality of connection pads spaced apart from each other along a perimeter of the through-hole forming the device accommodating portion S.

The second substrate 20 is electrically connected to the first substrate 10 through the connection conductors 50. The connection conductors 50 may be formed of a conductive adhesive such as solder or conductive resin.

The second substrate 20 may be a multilayer substrate formed of a plurality of layers, and may include a plurality of insulating layers 22, a wiring layer 21 disposed between the insulating layers 22, and interlayer connection conductors 23 connecting the wiring layers 21 to each other, in a manner similar to the first substrate 10.

The second substrate 20 may be, for example, a variety of substrates, such as a ceramic substrate, a printed circuit board, a flexible substrate, or the like.

The electrode pads 24 may be formed on both surfaces of the second substrate 20. The electrode pad 24 formed on the first surface of the second substrate 20 is electrically connected to the connection pad 16 of the first substrate 10, and is thus disposed to face the connection pad 16 of the first substrate 10. The electrode pad 24 formed on the second surface (a lower surface) of the second substrate 20 is connected to an external connection terminal 28. Thus, the first substrate 10 may be electrically connected to a main substrate (not illustrated) on which the electronic component module 100 is mounted, via the connection conductors 50, the second substrate 20 and the external connection terminal 28.

The second substrate 20 may include a plurality of conductive vias 25 interconnecting the electrode pads 24 disposed on the first and second surfaces thereof. In this example, the conductive vias 25 are disposed only in the edge of the second substrate 20, but the formation position thereof is not limited thereto. For example, the conductive vias 25 may be disposed in various positions as needed.

In this example, the second substrate 20 has the first surface that is wider than that of the device accommodating portion S provided in the first substrate 10. When the first substrate 10 is mounted on the second substrate 20, the second substrate 20 is not inserted into the device accommodating portion S, and at least a portion of the second substrate 20 contacts the second surface of the first substrate 10 to support the first substrate 10.

In this example, the device accommodating portion S is formed to have a quadrangular shape. Therefore, the second substrate 20 is formed to have a quadrangular shape having an area larger than that of the device accommodating portion S, and the first substrate 10 is mounted on the edge of the second substrate 20.

In this example, both a transversal length (an X-axis length) and a longitudinal length (a Y-axis length) of the second substrate 20 are formed to be greater than those of the device accommodating portion S, and contact the entire periphery of the device accommodating portion S while supporting the first substrate 10.

However, the configuration of the second substrate 20 is not limited thereto. For example, only one of the transversal length and the longitudinal length of the second substrate 20 may be greater than that of the device accommodating portion S. Thus, the second substrate 20 may be formed in various forms as long as the second substrate 20 can support the first support 10 without being accommodated in the device accommodating portion S.

The external connection terminal 28 is bonded to the electrode pad 24 disposed on the second surface of the second substrate 20. The external connection terminal 28 may be formed in a bump shape, but the shape thereof is not limited thereto, and the external connection terminal 28 may be formed in various shapes such as a solder ball or the like.

Although the external connection terminals 28 are illustrated as being disposed in two rows along the edge of the second substrate 20 in this example, an example of the present disclosure is not limited thereto and may be variously modified. For example, the external connection terminals 28 may be disposed in a lattice form on an entire lower surface of the second substrate 20.

Although not illustrated, an underfill resin may be disposed between the first substrate 10 and the second substrate 20. The underfill resin may be formed by injecting a liquid resin solution into a gap between the first substrate 10 and the second substrate 20 and then curing the resin solution.

In the electronic component module 100 according to the example described above, the electronic devices 1 are mounted on both surfaces of the first substrate 10, and are electrically connected externally through the second substrate 20 disposed on the lower surface of the first substrate 10.

Figure 11:
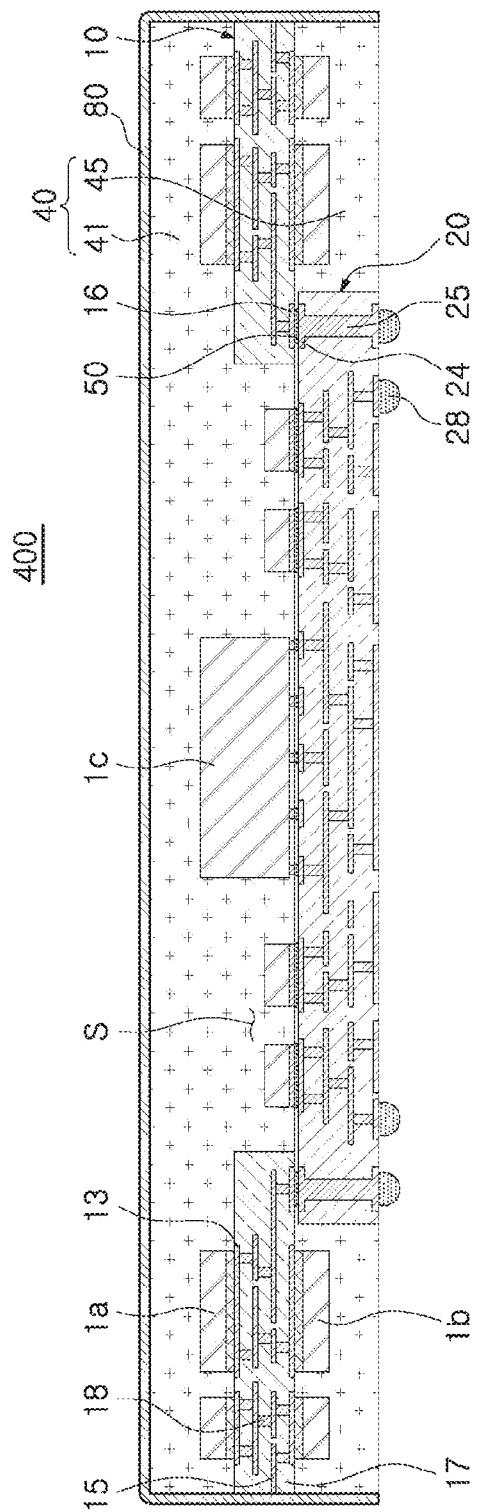
FIG. 11 is a cross-sectional view schematically illustrating an electronic component module according to another example.

Thus, since a plurality of the electronic devices 1 may be mounted on one substrate, for example, the first substrate 10, the degree of integration of devices may be increased. In addition, since an input/output path of the first substrate 10 on which the electronic devices 1 are mounted is formed through the second substrate 20, which is a separate substrate, even when both sides of the first substrate 10 are sealed as illustrated in FIG. 11, an external electrical connection may be facilitated.

The third device 1c mounted on the first surface of the second substrate 20 is disposed in the device accommodating portion S, and thus, may be mounted at a mounting height of a sum of a thickness of the first substrate 10 and a mounting height of the first device 1a mounted on the first surface of the first substrate 10. Therefore, a large-sized component may also be easily mounted.

In addition, in a case in which a heat generating element generating a lot of heat is mounted on the first surface of the second substrate 20, heat may be smoothly discharged to the main substrate through the second substrate 20. Therefore, a high heat dissipation performance may be provided.

On the other hand, the electronic component module according to an example is not limited to the above-described example, and the examples may be variously modified.

Figure 5:
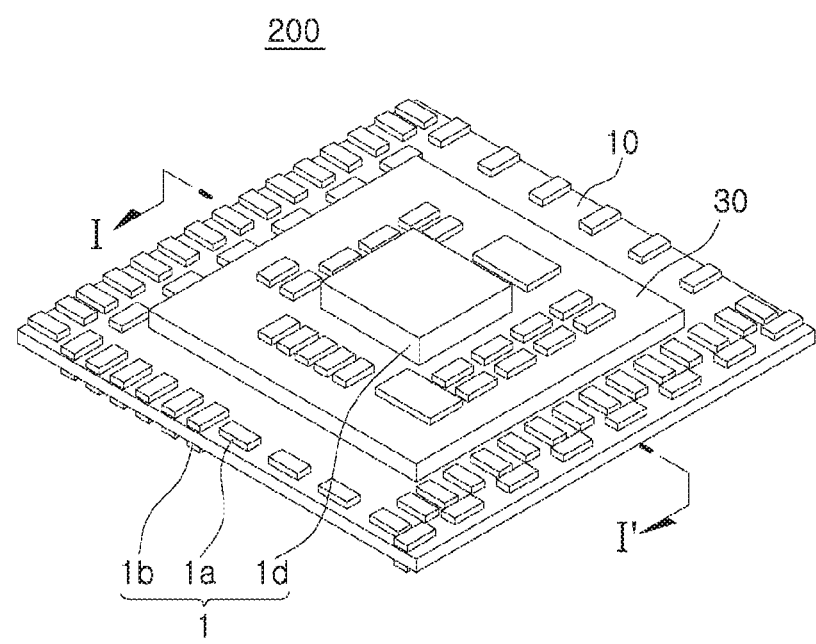
FIG. 5 is a perspective view schematically illustrating an electronic component module according to another example.
Figure 6:
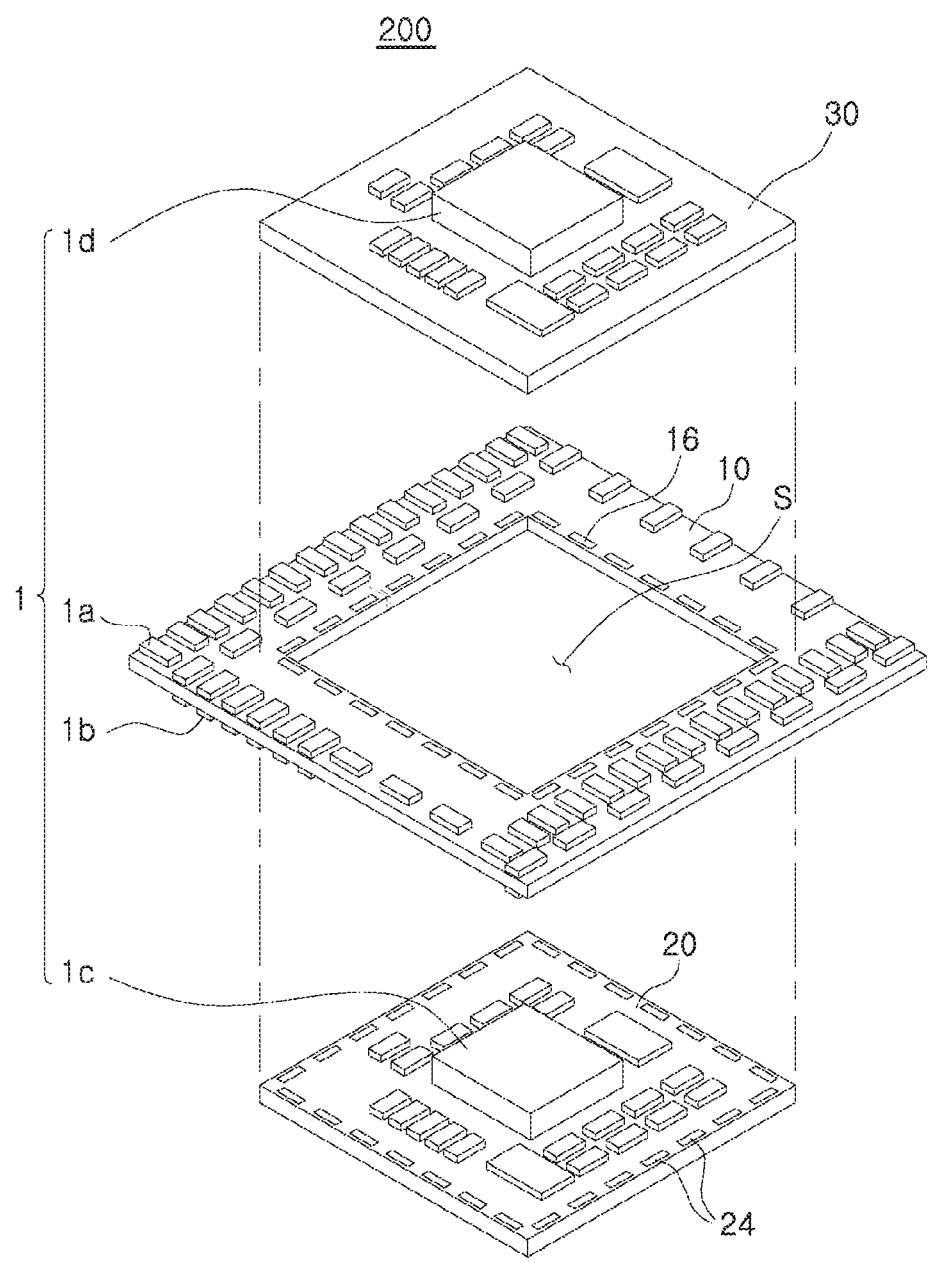
FIG. 6 is an exploded perspective view of the electronic component module illustrated in FIG. 5.
Figure 7:
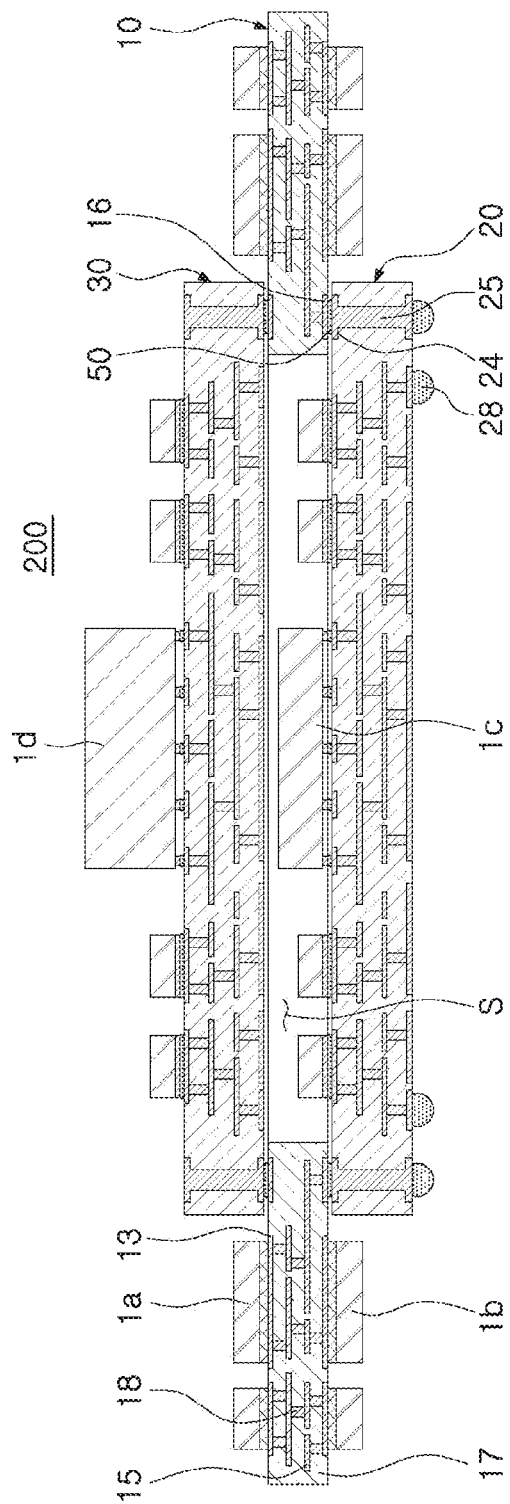
FIG. 7 is a cross-sectional view taken along line I-I' of FIG. 5.

FIG. 5 is a perspective view schematically illustrating an electronic component module according to another example, FIG. 6 is an exploded perspective view of the electronic component module illustrated in FIG. 5, and FIG. 7 is a sectional view taken along line I-I' of FIG. 5.

Referring to FIGS. 5 to 7, an electronic component module 200 includes a third substrate 30 mounted on the first surface of the first substrate 10.

The third substrate 30 may be formed to have the same or similar size and shape as those of the second substrate 20. Accordingly, the third substrate 30 is disposed in such a manner that a lower surface thereof faces the upper surface of the second substrate 20, and has an area greater than that of the device accommodating portion S of the first substrate 10. The electronic device 1 may be mounted on both surfaces of the third substrate 30. For example, fourth device 1d may be mounted on an upper surface of the third substrate.

By providing the third substrate 30, the device accommodating portion S is formed as a closed space. Therefore, the electronic devices disposed in the device accommodating portion S may be blocked from electromagnetic waves by the first, second, and third substrates 10, 20 and 30.

A shielding member (not illustrated) formed of a conductive material may be disposed on an inner wall of the first substrate 10 of the example, in which the device accommodating portion S is formed, to more effectively block the inflow/outflow of electromagnetic waves. The shielding member may be formed as a metal layer or a metal film, but is not limited thereto.

Figure 8:
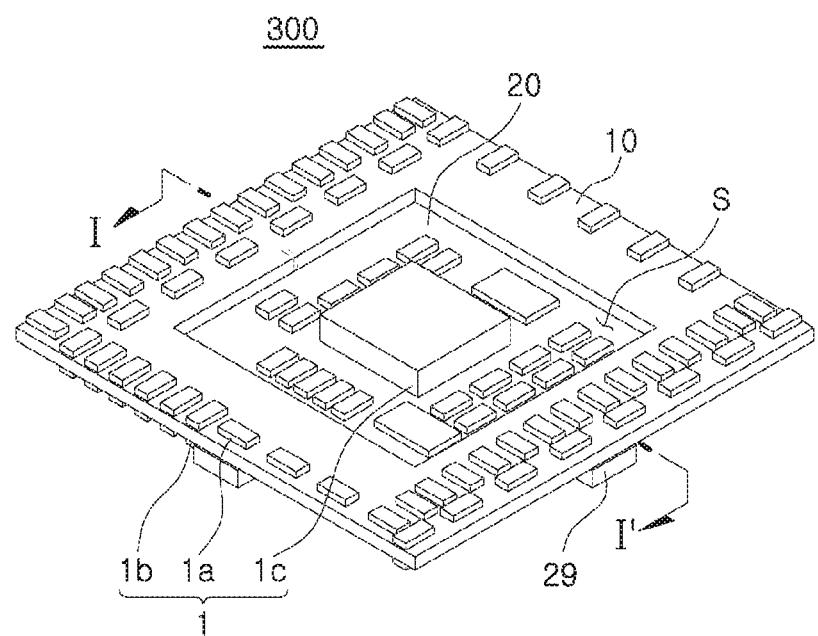
FIG. 8 is a perspective view schematically illustrating an electronic component module according to another example.
Figure 9:
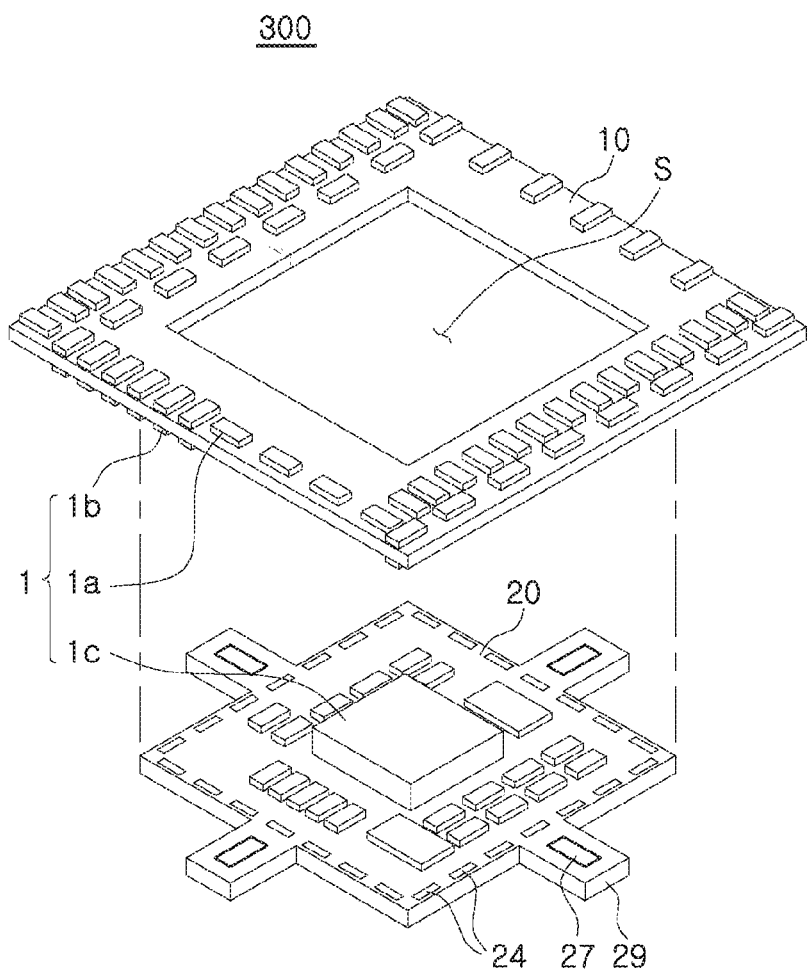
FIG. 9 is an exploded perspective view of the electronic component module illustrated in FIG. 8.
Figure 10:
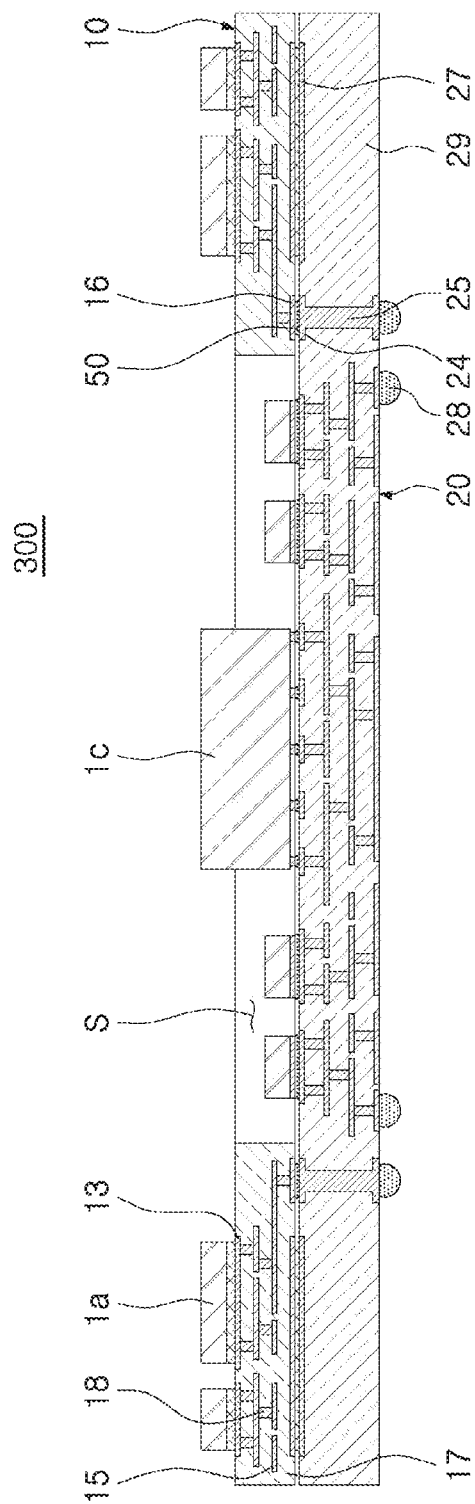
FIG. 10 is a cross-sectional view taken along line I-I' of FIG. 8

FIG. 8 is a perspective view schematically illustrating an electronic component module according to another example, FIG. 9 is an exploded perspective view of the electronic component module illustrated in FIG. 8, and FIG. 10 is a sectional view taken along line I-I' of FIG. 8.

Referring to FIGS. 8 to 10, an electronic component module 300 is configured similarly to the electronic component module illustrated in FIG. 1, and has a difference therefrom in that at least one support portion 29 is provided on the second substrate 20.

The support portion 29 is a portion protruding outwardly from a side surface of the second substrate 20 formed in a quadrangular shape and supports the first substrate 10 on a lower portion of the first substrate 10.

A conductive pad 27 is disposed on an upper surface of the support portion 29 to be electrically connected to the first substrate 10. In this example, a dummy pad is also disposed on the second surface of the first substrate 10 and bonded to the conductive pad 27 of the first substrate 10 through a conductive adhesive, but an example thereof is not limited thereto and may be variously modified. For example, the first substrate 10 and an insulating layer of the support portion 29 may be bonded to each other using a resin adhesive such as epoxy, rather than disposing the conductive pad 27 on the support portion 29. In addition, the conductive pad 27 may be configured with an electrode pad instead of the dummy pad.

In this example, in the case of the support portion 29, support portions are formed in a protruding shape to protrude from four sides of the second substrate 20, but an example thereof is not limited thereto. For example, the number of the support portions 29 and the protruding position thereof may be modified.

In the case of the electronic component module 300, configured as described above, since the first substrate 10 is supported through the support portion 29, the first substrate 10 may be mounted on the second substrate 20 more stably. Also, reliability of bonding between the first substrate 10 and the second substrate 20 may be secured.

FIG. 11 is a cross-sectional view schematically illustrating an electronic component module according to another example.

Referring to FIG. 11, an electronic component module 400 is configured similar to the electronic component module illustrated in FIG. 1, and has a difference therefrom in that the electronic component module 400 includes a sealing portion 40 and a shielding layer 80.

The sealing portion 40 may include a first sealing portion 41 formed on the first surface of the first substrate 10 and a second sealing portion 45 formed on the second surface of the first substrate 10.

The first sealing portion 41 seals the first surface of the first substrate 10 and the electronic devices 1 mounted on the first surface of the second substrate 20. All the third devices 1c accommodated in the device accommodating portion S are all embedded in the first sealing portion 41. The electronic devices 1 may be entirely embedded in the sealing portion 40, but may be configured to be partially exposed externally of the sealing portion 40 as required.

The first sealing portion 41 is filled between the electronic devices 1 mounted on the first substrate 10, thereby preventing an electrical short between the electronic devices 1 from occurring. The sealing portion 40 surrounds the outside of the electronic devices 1 to fix the electronic devices 1 on a substrate to safely protect the electronic devices 1 from external impacts.

The second sealing portion 45 is disposed on the second surface of the first substrate 10, for example, along an edge of the second substrate 20, to seal the second devices 1b mounted on the second surface of the first substrate 10. Alternatively, the second sealing portion 45 may be configured in such a manner that a portion of the second device 1b is exposed externally of the second sealing part 45 as required.

The second surface, a lower surface, of the second substrate 20 is exposed externally of the second sealing portion 45, but an example thereof is not limited thereto. For example, the second sealing portion 45 may also be configured to embed the entirety of the second substrate 20. In this case, external connection terminals 28 pass through the second sealing portions 45 disposed below the second substrate 20, to be bonded to the electrode pads 24 of the second substrate 20.

The sealing portion 40 may be formed of an insulating material including a resin material such as epoxy. The sealing portion 40 may be formed, by placing the first and second substrates 10 and 20 on which the electronic devices 1 are mounted, in a mold (not illustrated), and by injecting a molding resin into the mold, but an example thereof is not limited thereto.

The shielding layer 80 is disposed along a surface formed by the sealing portion 40 and the first substrate 10, and blocks electromagnetic waves that flow into the electronic device 1 externally or flows out from the electronic device 1 externally. Accordingly, the shielding layer 80 is formed of a conductive material.

In this example, the shielding layer 80 may be electrically connected to a ground wiring or a ground layer exposed on a side surface of the first substrate 10.

The shielding layer 80 may be formed by applying a resin material containing conductive powder to an outer surface of the sealing portion 40, or may be formed of a metal thin film. Various techniques such as sputtering, screen printing, vapor deposition, electrolytic plating, and non-electrolytic plating may be used in the case of forming the metal thin film. For example, the shielding layer 80 may be a metal thin film formed by a spray coating method on the surface formed by the sealing portion 40 and the first substrate 10.

Figure 12:
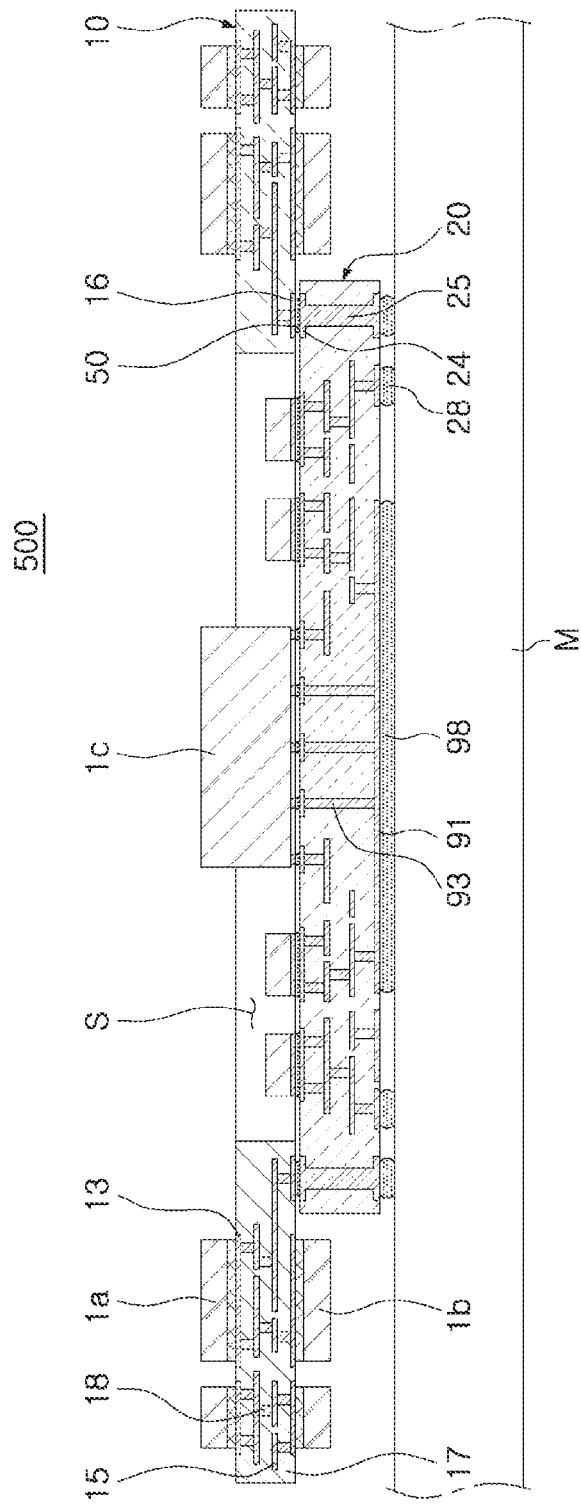
FIG. 12 is a cross-sectional view schematically illustrating an electronic component module according to another example.

FIG. 12 is a cross-sectional view schematically illustrating an electronic component module according to another example.

Referring to FIG. 12, in the case of an electronic component module 500, a heat dissipation pad 91 is provided on a lower surface of the second substrate 20. The heat dissipation pad 91 is in surface contact with an upper surface of a main substrate M through a heat transfer member 98 to discharge heat toward the main substrate M.

In this case, a conductive adhesive such as solder may be used for the heat transfer member 98, but an example thereof is not limited thereto. For example, as a material of the heat transfer member 98, various materials may be used as long as it has a relatively high thermal conductivity such as thermal grease or the like.

In addition, the second substrate 20 may include at least one heat dissipation via 93. One end of the heat dissipation via 93 may be directly connected to the third device 1c, a heat generating element, and the other end thereof may be connected to the heat dissipation pad 91. Accordingly, in the case of the electronic component module according to an example of the present disclosure, heat generated in the heat generating element may be rapidly discharged toward the main substrate M through the heat dissipation via 93 and the heat dissipation pad 91.

Although this example illustrates the case in which one end of the heat dissipation via 93 is directly connected to the heat generating element, but the configuration is not limited thereto. For example, one end of the heat dissipation via 93 may be indirectly connected to the heat generating element. Further, the heat dissipation pad 91 may be omitted, and the other end of the heat dissipation via 93 may be directly connected to the heat transfer member 98, as various modification examples.

In the above-described examples, although the case in which a side surface of the first substrate is exposed externally of the sealing portion is provided as an example, the side surface of the first substrate may be embedded in the sealing portion as required. In this case, the shielding layer may be electrically connected to the ground electrode disposed on an upper surface of the first substrate through a conductive via or the like disposed to penetrate through the first sealing portion. Further, the above-described examples may be implemented in combination with each other.

As set forth above, with an electronic component module according to an example, since electronic components are mounted on both surfaces of a first substrate, the degree of integration of elements may be increased, and mounting the components having a relatively large size may be facilitated.

Further, heat generated from the heat generating element may be smoothly discharged to the main substrate, thereby providing a high heat dissipation performance.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic component module comprising:
   a first substrate comprising a device accommodating portion, the first substrate mounted on an upper surface of a second substrate such that at least a portion of a lower surface of the first substrate is exposed externally of the second substrate, wherein at least one electronic device is mounted on the lower surface of the first substrate in vertical misalignment with the upper surface of the second substrate; and
   electronic devices mounted on the first substrate and the second substrate, including at least one electronic device mounted on the upper surface of the second substrate,
   wherein the device accommodating portion accommodates the at least one electronic device directly connected to the upper surface of the second substrate.

2. The electronic component module of claim 1, wherein the first substrate is mounted on the second substrate along an edge of the second substrate.

3. The electronic component module of claim 2, wherein the second substrate has a quadrangular shape, and the first substrate has a quadrangular ring shape.

4. The electronic component module of claim 1, wherein the at least one electronic device mounted on the upper surface of the second substrate has a mounting height lower than a sum of a thickness of the first substrate and a mounting height of an electronic device mounted on an upper surface of the first substrate.

5. The electronic component module of claim 1, wherein another electronic device is mounted on the lower surface of the first substrate in vertical alignment with the upper surface of the second substrate.

6. The electronic component module of claim 1, wherein the at least one electronic device mounted on the lower surface of the first substrate exposed externally of the second substrate has a mounting height, from the lower surface of the first substrate, lower than a thickness of the second substrate.

7. The electronic component module of claim 1, wherein the second substrate comprises a support portion protruding outwardly to support the lower surface of the first substrate.

8. The electronic component module of claim 1, further comprising a third substrate mounted on an upper surface of the first substrate.

9. The electronic component module of claim 8, wherein the third substrate is disposed such that a lower surface of the third substrate faces the upper surface of the second substrate.

10. The electronic component module of claim 8, wherein the second substrate and the third substrate have the same size.

11. The electronic component module of claim 8, wherein the at least one electronic device mounted on the upper surface of the second substrate has a mounting height, from the lower surface of the first substrate, lower than a thickness of the first substrate.

12. The electronic component module of claim 1, further comprising a sealing portion sealing the electronic devices.

13. The electronic component module of claim 12, further comprising a shielding layer disposed along a surface of the sealing portion.

14. The electronic component module of claim 12, wherein the sealing portion comprises
   a first sealing part configured to seal at least one electronic device mounted on the upper surface of the first substrate and the at least one electronic device mounted on the upper surface of the second substrate, and
   a second sealing part disposed on a lower surface of the first substrate and along a circumference of the second substrate configured to seal the at least one electronic device mounted on the lower surface of the first substrate.

15. The electronic component module of claim 1, wherein the second substrate comprises a heat dissipation pad disposed on a lower surface of the second substrate, and
   wherein the heat dissipation pad is in surface contact with an upper surface of a main substrate through a heat transfer member in a case in which the second substrate is mounted on the main substrate.

16. The electronic component module of claim 15, wherein the second substrate comprises a heat dissipation via having one end connected to the at least one electronic device mounted on the upper surface of the second substrate and another end connected to the heat dissipation pad, to transfer heat generated by the at least one electronic device mounted on the upper surface of the second substrate to the heat dissipation pad.

17. An electronic component module comprising:
   a first substrate comprising a device accommodating portion, the first substrate mounted on an upper surface of a second substrate such that at least a portion of a lower surface of the first substrate is exposed externally of the second substrate;
   a heat generating element mounted on the second substrate; and
   at least one electronic device mounted on both an upper surface of the first substrate and the lower surface of the first substrate,
   wherein the electronic device mounted on the lower surface of the first substrate is in vertical misalignment with the upper surface of the second substrate, and the device accommodating portion accommodates an electronic device directly connected to the upper surface of the second substrate.

18. The electronic component module of claim 17, wherein the heat generating element has a mounting height, from the lower surface of the first substrate, lower than a sum of a thickness of the first substrate and a mounting height of the at least one electronic device mounted on the upper surface of the first substrate.

19. An electronic component module comprising:
- a first substrate;
- a second substrate mounted on the first substrate and comprising an opening disposed along an edge portion of an upper surface of the first substrate on which the second substrate is mounted;
- a first electronic device directly connected to the upper surface of the first substrate and extending through the opening; and
- a second electronic device mounted on a lower surface of the second substrate, which faces the upper surface of the first substrate, in a region external to the edge portion and in vertical misalignment with the upper surface of the first substrate.

* * * * *